United States Patent
Hong et al.

(10) Patent No.: US 11,276,673 B2
(45) Date of Patent: Mar. 15, 2022

(54) MULTI PIXEL LED PACKAGES

(71) Applicant: LUMENS CO., LTD., Yongin-si (KR)

(72) Inventors: Inyeol Hong, Yongin-si (KR); Sungsik Jo, Yongin-si (KR); Seunghyun Oh, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 70 days.

(21) Appl. No.: 16/614,360

(22) PCT Filed: Sep. 13, 2018

(86) PCT No.: PCT/KR2018/010737
§ 371 (c)(1),
(2) Date: Nov. 16, 2019

(87) PCT Pub. No.: WO2020/054888
PCT Pub. Date: Mar. 19, 2020

(65) Prior Publication Data
US 2020/0161281 A1 May 21, 2020

(30) Foreign Application Priority Data
Sep. 12, 2018 (KR) .................. 10-2018-0109171

(51) Int. Cl.
*H01L 25/075* (2006.01)
*H01L 23/538* (2006.01)
*H01L 33/62* (2010.01)

(52) U.S. Cl.
CPC ...... *H01L 25/0753* (2013.01); *H01L 23/5383* (2013.01); *H01L 23/5386* (2013.01); *H01L 33/62* (2013.01)

(58) Field of Classification Search
CPC ............. H01L 25/0753; H01L 23/5383; H01L 23/5386; H01L 33/62; H01L 33/56; H01L 33/52
See application file for complete search history.

(56) References Cited

U.S. PATENT DOCUMENTS

2007/0205423 A1* 9/2007 Yamazaki ........... H01L 27/3213
257/89
2010/0141626 A1* 6/2010 Tomida ................ G09G 3/3233
345/211

(Continued)

*Primary Examiner* — Marcos D. Pizarro
(74) *Attorney, Agent, or Firm* — Mei & Mark LLP

(57) ABSTRACT

A multi-pixel LED package is disclosed. The multi-pixel LED package includes: n pixel groups (where n is a natural number equal to or greater than 2), each of which includes a plurality of pixels, each of which includes a first LED chip, a second LED chip, and a third LED chip; and a substrate on which the n pixel groups are arrayed. The substrate includes first individual electrodes individually connected to first conductive electrodes of the first LED chips in the pixel groups, second individual electrodes individually connected to first conductive electrodes of the second LED chips in the pixel groups, third individual electrodes individually connected to first conductive electrodes of the third LED chips in the pixel groups, common electrodes connected in common to second conductive electrodes of the first LED chips, the second LED chips, and the third LED chips in the pixel groups, first connectors connected to all of the first individual electrodes in the pixel groups, second connectors connected to all of the second individual electrodes in the pixel groups, third connectors connected to all of the third individual electrodes in the pixel groups, fourth connectors individually connected to all of the common electrodes in the pixel groups, first power terminals individually connected to the first connectors, second power terminals individually connected to the second connectors, third power terminals individually connected to the third connectors, and fourth power terminals individually connected to the fourth connectors.

24 Claims, 8 Drawing Sheets

(56) References Cited

U.S. PATENT DOCUMENTS

2018/0190184 A1\* 7/2018 Kim .................... H01L 27/3241
2019/0096864 A1\* 3/2019 Huitema ................. H01L 24/82

\* cited by examiner

[FIG. 1]
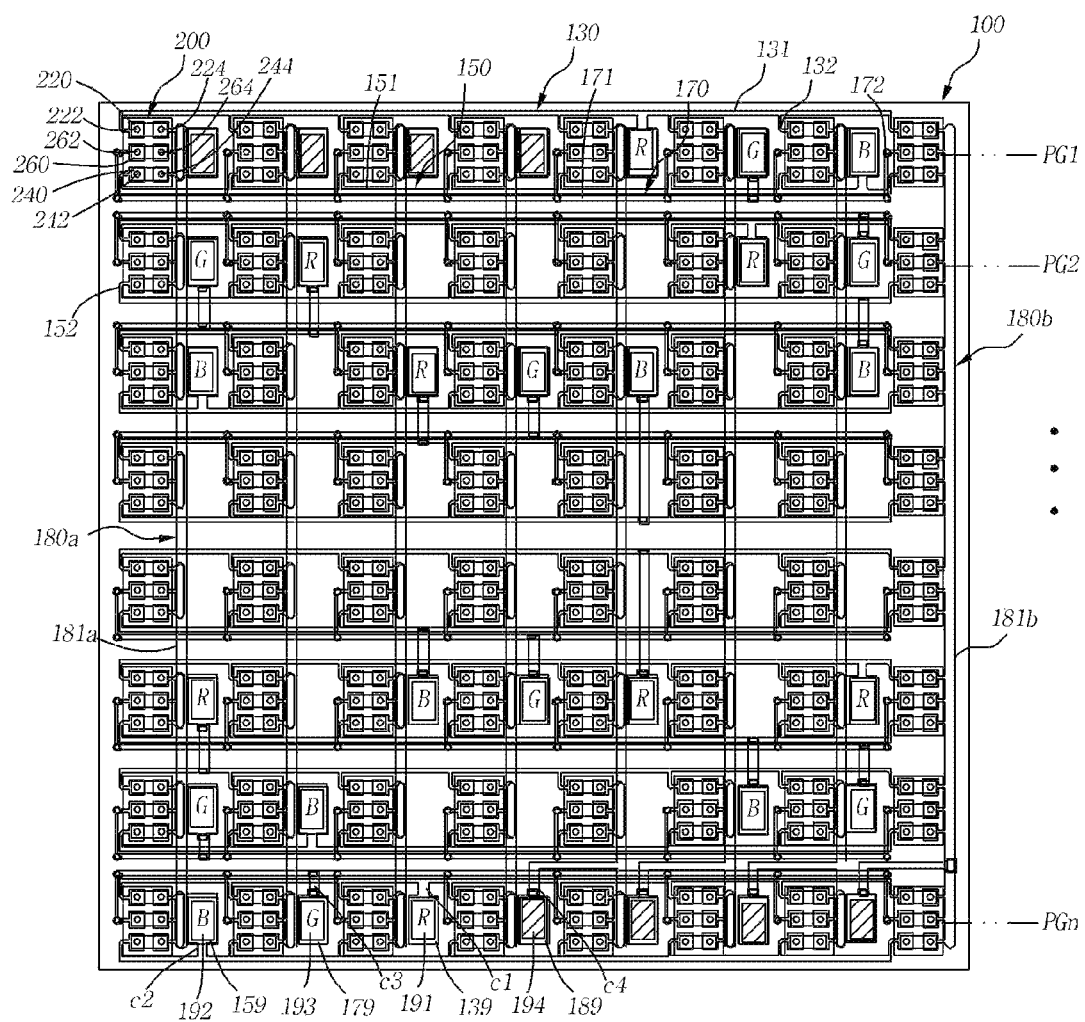

[FIG. 2]
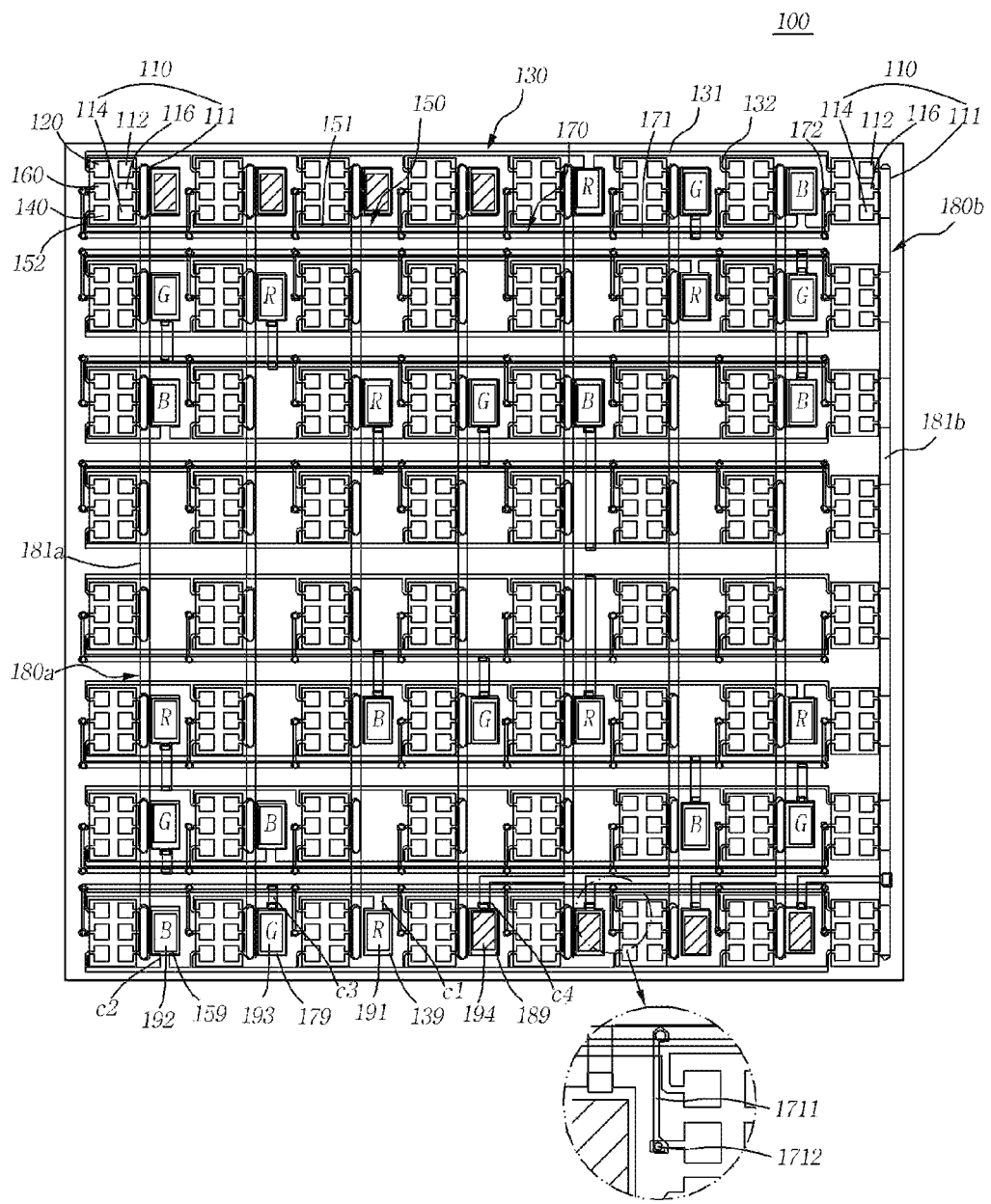

【FIG. 3】

| (R1, A1) (G1, A1) (B1, A1) | (R1, A2) (G1, A2) (B1, A2) | (R1, A3) (G1, A3) (B1, A3) | (R1, A4) (G1, A4) (B1, A4) | (R1, A5) (G1, A5) (B1, A5) | (R1, A6) (G1, A6) (B1, A6) | (R1, A7) (G1, A7) (B1, A7) | (R1, A8) (G1, A8) (B1, A8) |
|---|---|---|---|---|---|---|---|
| (R2, A1) (G2, A1) (B2, A1) | (R2, A2) (G2, A2) (B2, A2) | (R2, A3) (G2, A3) (B2, A3) | (R2, A4) (G2, A4) (B2, A4) | (R2, A5) (G2, A5) (B2, A5) | (R2, A6) (G2, A6) (B2, A6) | (R2, A7) (G2, A7) (B2, A7) | (R2, A8) (G2, A8) (B2, A8) |
| (R3, A1) (G3, A1) (B3, A1) | (R3, A2) (G3, A2) (B3, A2) | (R3, A3) (G3, A3) (B3, A3) | (R3, A4) (G3, A4) (B3, A4) | (R3, A5) (G3, A5) (B3, A5) | (R3, A6) (G3, A6) (B3, A6) | (R3, A7) (G3, A7) (B3, A7) | (R3, A8) (G3, A8) (B3, A8) |
| (R4, A1) (G4, A1) (B4, A1) | (R4, A2) (G4, A2) (B4, A2) | (R4, A3) (G4, A3) (B4, A3) | (R4, A4) (G4, A4) (B4, A4) | (R4, A5) (G4, A5) (B4, A5) | (R4, A6) (G4, A6) (B4, A6) | (R4, A7) (G4, A7) (B4, A7) | (R4, A8) (G4, A8) (B4, A8) |
| (R5, A1) (G5, A1) (B5, A1) | (R5, A2) (G5, A2) (B5, A2) | (R5, A3) (G5, A3) (B5, A3) | (R5, A4) (G5, A4) (B5, A4) | (R5, A5) (G5, A5) (B5, A5) | (R5, A6) (G5, A6) (B5, A6) | (R5, A7) (G5, A7) (B5, A7) | (R5, A8) (G5, A8) (B5, A8) |
| (R6, A1) (G6, A1) (B6, A1) | (R6, A2) (G6, A2) (B6, A2) | (R6, A3) (G6, A3) (B6, A3) | (R6, A4) (G6, A4) (B6, A4) | (R6, A5) (G6, A5) (B6, A5) | (R6, A6) (G6, A6) (B6, A6) | (R6, A7) (G6, A7) (B6, A7) | (R6, A8) (G6, A8) (B6, A8) |
| (R7, A1) (G7, A1) (B7, A1) | (R7, A2) (G7, A2) (B7, A2) | (R7, A3) (G7, A3) (B7, A3) | (R7, A4) (G7, A4) (B7, A4) | (R7, A5) (G7, A5) (B7, A5) | (R7, A6) (G7, A6) (B7, A6) | (R7, A7) (G7, A7) (B7, A7) | (R7, A8) (G7, A8) (B7, A8) |
| (R8, A1) (G8, A1) (B8, A1) | (R8, A2) (G8, A2) (B8, A2) | (R8, A3) (G8, A3) (B8, A3) | (R8, A4) (G8, A4) (B8, A4) | (R8, A5) (G8, A5) (B8, A5) | (R8, A6) (G8, A6) (B8, A6) | (R8, A7) (G8, A7) (B8, A7) | (R8, A8) (G8, A8) (B8, A8) |

【FIG. 4】

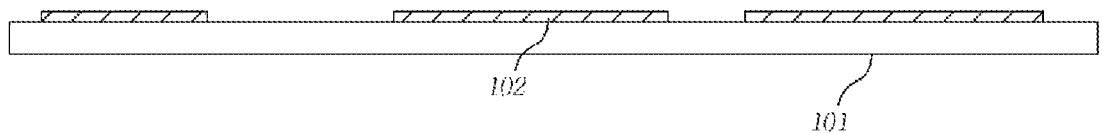

【FIG. 5】
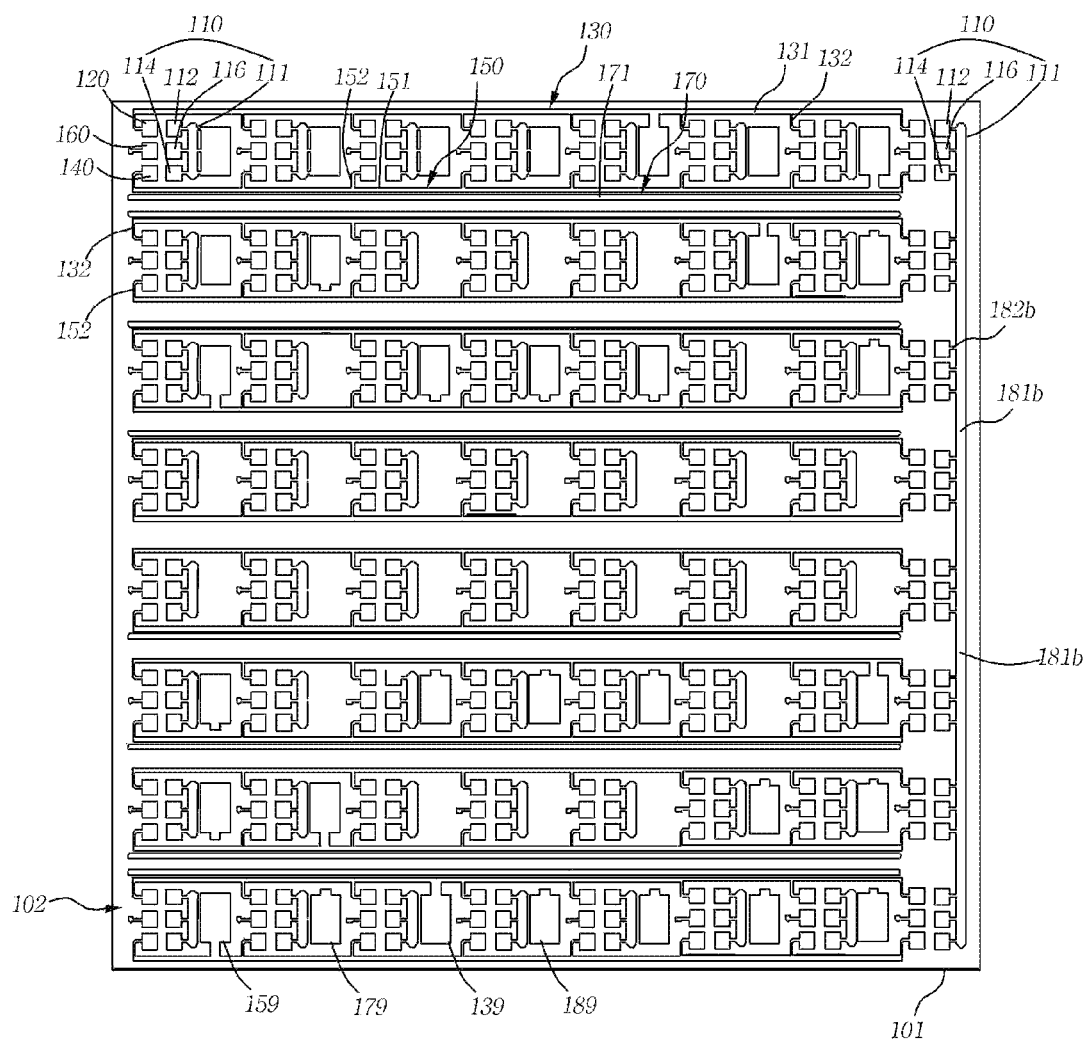
【FIG. 6】
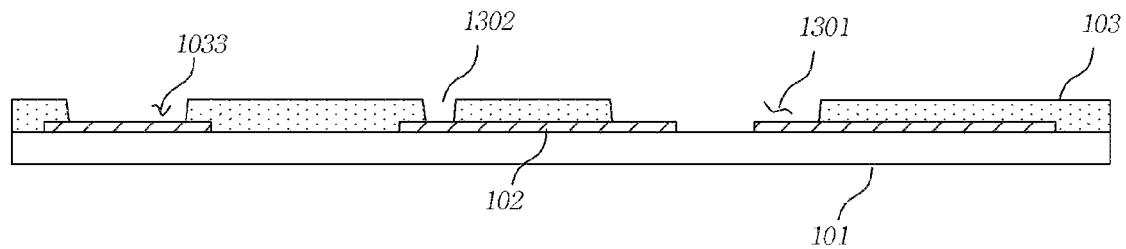

【FIG. 7】
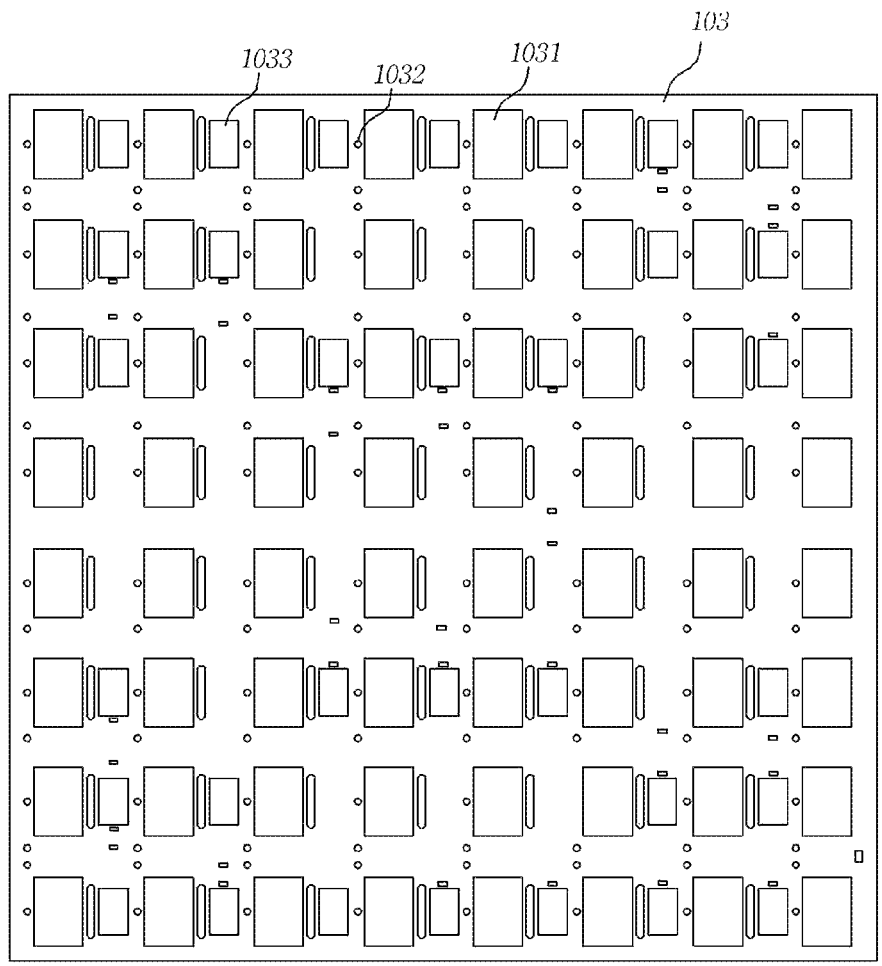
【FIG. 8】
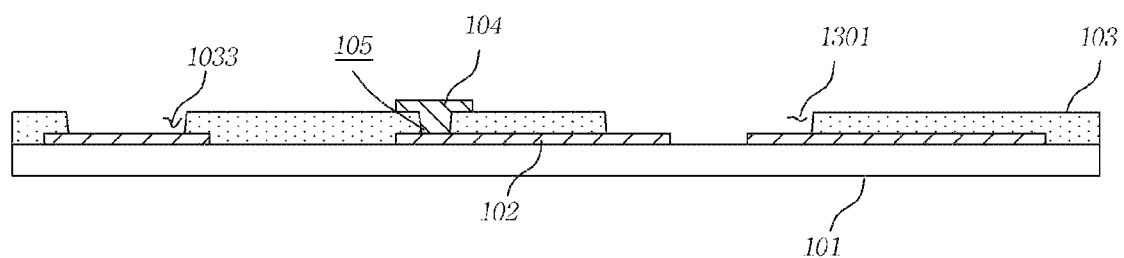

[FIG. 9]
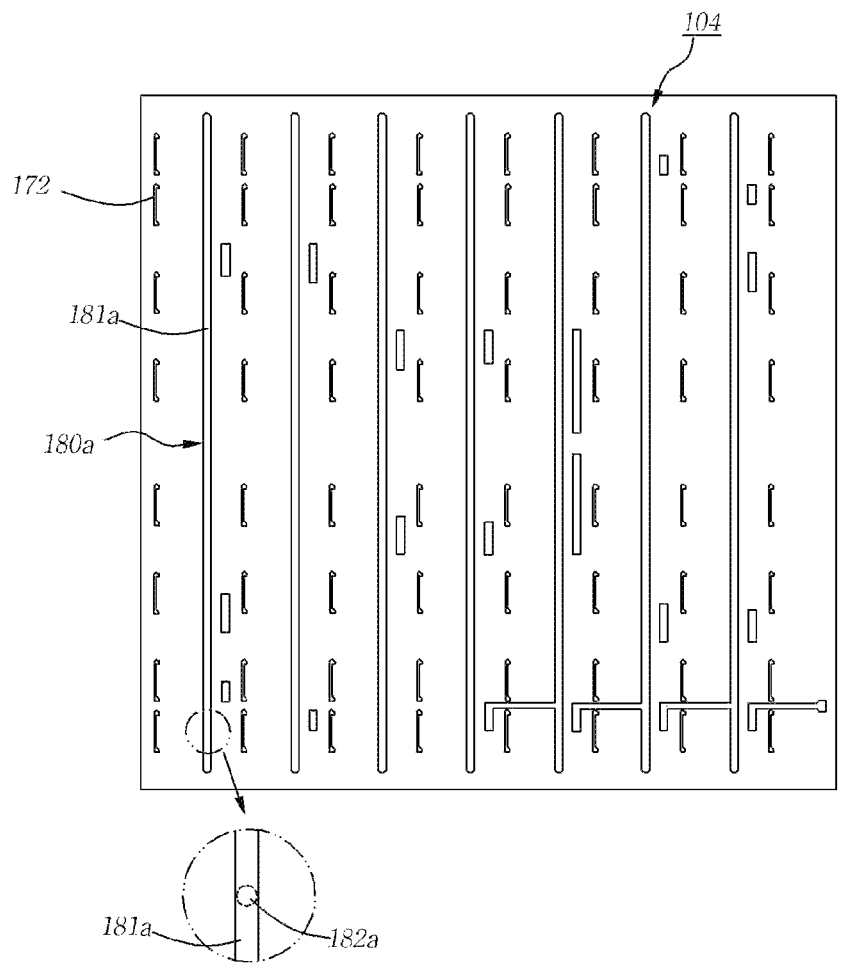
[FIG. 10]
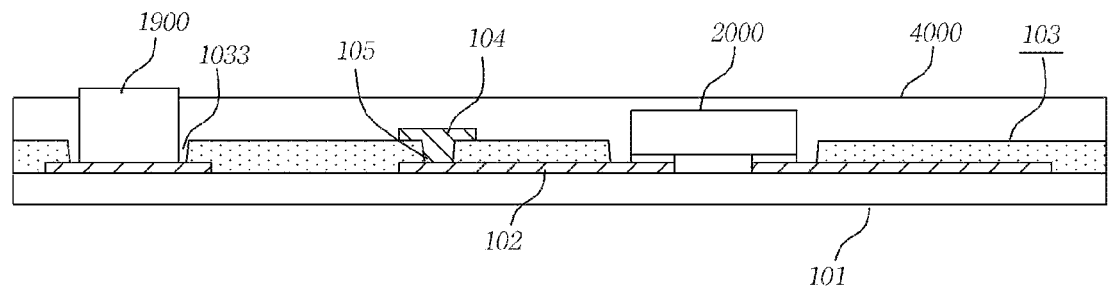

【FIG. 11】
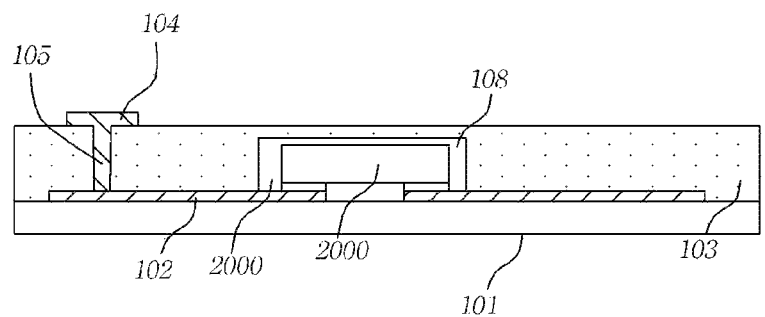
【FIG. 12】
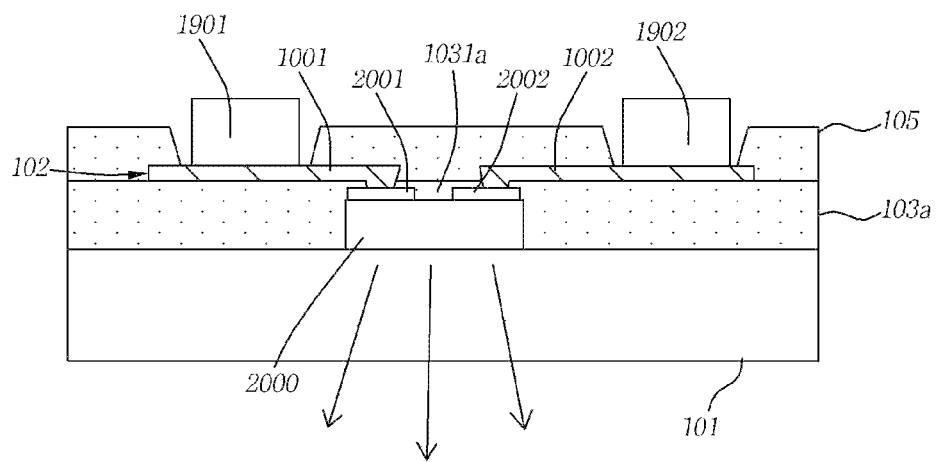

[FIG. 13]
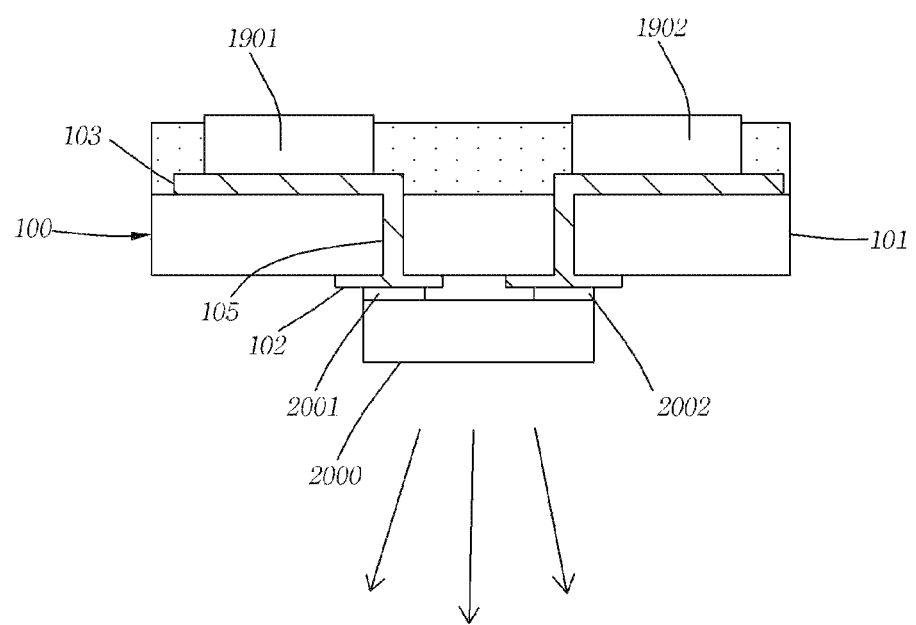

MULTI PIXEL LED PACKAGES

TECHNICAL FIELD

The present invention relates to multi-pixel LED packages including a plurality of LED pixels, and more specifically to multi-pixel LED packages for displays in which a plurality of pixels and their constituent LED chips can be controlled individually.

BACKGROUND ART

Full-color LED displays in which LEDs emitting light of different wavelengths are grouped into pixels have been proposed as potential replacements for displays using LEDs as backlight sources. Each of the pixels consists of red, green, and blue LEDs or red, green, blue, and white LEDs. In such an LED display, red, green, and blue LEDs are packaged and mounted on a substrate. However, when the distances between the constituent LEDs of pixels are above a predetermined level, high-quality resolution is difficult to obtain. Pixels consisting of package-type LEDs are difficult to apply to micro-LED displays that have recently received attention.

In view of this, there have been proposed single-pixel LED packages in which red, green, and blue LED chips are mounted to constitute one pixel. Such single-pixel LED packages require a large number of terminals to individually drive LEDs including red, green, and blue LEDs. The large number of terminals leads to an excessively small pitch between the terminals, causing short-circuiting and limitations in designing circuits of PCBs mounted with LED packages.

In an attempt to solve these problems, a proposal has been made for a single-pixel LED package including four terminals consisting of three cathode terminals and one common anode terminal. Such single-pixel packages are arrayed on a PCB to create a digital signage such that intended LED pitches and resolution are achieved. However, with increasing demand to reduce the density of pixels per screen area, the application of single-pixel LED packages, each including four terminals, also involves many limitations in PCB design owing to minimum pitches between the terminals. The limited PCB design requires sophisticated PCBs. This incurs an increased processing cost, leading to an increase in fabrication cost. Further, when general printed circuit boards (PCBs) are used to implement circuits for individual RGB driving, there is a difficulty in reducing the width and pitch of electrodes.

The limitation in reducing the width and pitch of electrodes leads to a difficulty in reducing the intervals between LED pixels and between LED chips in the pixels, thus failing to achieve high-resolution display quality. There is another problem in that circuit design for forming electrodes connected to drive ICs is complex. Further, densely packed electrodes and/or interconnection lines lead to a voltage envelope to produce a difference in voltage between LEDs, causing an optical deviation. Problems are encountered when LED packages or LED chips are transferred individually.

DETAILED DESCRIPTION OF THE INVENTION

Technical Tasks

The present invention has been made in view of the above-mentioned problems, and an object of the present invention is to provide multi-pixel LED packages including using a greatly reduced number of terminals per pixel.

Another object of the present invention is to provide multi-pixel LED packages that are free from problems, such as limited widths of electrodes and circuit patterns formed on a substrate and connected to drive ICs, complex circuit design, and a voltage envelope caused by densely packed circuit interconnection lines, when micro-LED chips are combined into a plurality of pixels

Technical Solutions

One aspect of the present invention provides a multi-pixel LED package including: n pixel groups (where n is a natural number equal to or greater than 2), each of which includes a plurality of pixels, each of which includes a first LED chip, a second LED chip, and a third LED chip; and a substrate on which the n pixel groups are arrayed, wherein the substrate includes first individual electrodes individually connected to first conductive electrodes of the first LED chips in the pixel groups, second individual electrodes individually connected to first conductive electrodes of the second LED chips in the pixel groups, third individual electrodes individually connected to first conductive electrodes of the third LED chips in the pixel groups, common electrodes connected in common to second conductive electrodes of the first LED chips, the second LED chips, and the third LED chips in the pixel groups, first connectors connected to all of the first individual electrodes in the pixel groups, second connectors connected to all of the second individual electrodes in the pixel groups, third connectors connected to all of the third individual electrodes in the pixel groups, fourth connectors individually connected to all of the common electrodes in the pixel groups, first power terminals individually connected to the first connectors, second power terminals individually connected to the second connectors, third power terminals individually connected to the third connectors, and fourth power terminals individually connected to the fourth connectors.

According to one embodiment, the number of the pixels in each of the pixel groups is n; the pixels are arrayed along the widthwise direction; and the n pixel groups are arrayed in the lengthwise direction.

According to one embodiment, each of the first connectors, the second connectors, and the third connectors includes a global connection line disposed parallel to the corresponding pixel group along the widthwise direction and local connection lines connecting the individual electrodes in the corresponding pixel group to the corresponding global connection line.

According to one embodiment, each of the first connectors includes a first global connection line disposed along the widthwise direction while being spaced apart from one side of the corresponding pixel group and first local connection lines connecting the first individual electrodes in the corresponding pixel group to the first global connection line; each of the second connectors includes a second global connection line disposed along the widthwise direction while being spaced apart from the other side of the corresponding pixel group and second local connection lines connecting the second individual electrodes in the corresponding pixel group to the second global connection line; and each of the third connectors includes a third global connection line disposed along the widthwise direction and arranged to face the corresponding pixel group through the second global connection line and third local connection lines connecting the third individual electrodes in the corresponding pixel group to the third global connection line.

According to one embodiment, the first global connection line and the first local connection lines lie in the same plane as the first individual electrodes; and the second global connection line and the second local connection lines lie in the same plane as the second individual electrodes.

According to one embodiment, the first global connection line and the first local connection lines lie in the same plane as the first individual electrodes; the second global connection line and the second local connection lines lie in the same plane as the second individual electrodes; the third global connection line lies in the same plane as the third individual electrodes; and the third local connection lines include horizontal line portions traversing the second global connection lines at a different height from the third individual electrodes and vertical line portions individually connecting the horizontal line portions to the third individual electrodes and the third local connection lines.

According to one embodiment, the fourth connectors include global connection lines disposed along the lengthwise direction and local connection lines connecting the n common electrodes arrayed along the columns of the corresponding pixels to the corresponding global connection lines.

According to one embodiment, the fourth connectors include n−1 fourth connectors whose global connection lines are disposed at a different height from the common electrodes and a single fourth connector whose global connection line lies in the same plane as the common electrodes; and the single fourth connector is located in the first or $n^{th}$ column.

According to one embodiment, each of the n−1 fourth connectors includes local lines vertically extending from the global connection line at a different height from the common electrodes to the common electrodes.

According to one embodiment, each of the common electrodes corresponding to the global connection line of the single fourth connector includes a first branch, a second branch, and a third branch to which the second conductive electrodes of the first LED chip, the second LED chip, and the third LED chip are bonded, respectively, and a stem at which the first branch, the second branch, and the third branch merge; and the stem is integrated as a portion of the global connection line of the single fourth connector.

According to one embodiment, each of the common electrodes includes a stem connected to one of the local connection lines and a first branch, a second branch, and a third branch diverging from the stem and to which the second conductive electrodes of the first LED chip, the second LED chip, and the third LED chip are bonded, respectively.

According to one embodiment, first power terminal contact portions, second power terminal contact portions, third power terminal contact portions, and fourth power terminal contact portions are connected to the first global connection lines, the second global connection lines, the third global connection lines, and the fourth global connection lines through contact connectors, respectively; and the first power terminals, the second power terminals, the third power terminals, and the fourth power terminals are connected to the first connectors, the second connectors, the third connectors, and the fourth connectors while being in contact with the first power terminal contact portions, the second power terminal contact portions, the third power terminal contact portions, and the fourth power terminal contact portions, respectively.

According to one embodiment, the first power terminal contact portions, the second power terminal contact portions, the third power terminal contact portions, and the fourth power terminal contact portions lie in the same plane as the first global connection lines, the second global connection lines, and the third global connection lines; and at least one of the fourth global connection lines is at a different height from the fourth power terminal contact portions.

According to one embodiment, each of the contact connectors includes: a first contact connector as a horizontal connection portion lying entirely in the same plane as the first power terminal contact portions, the second power terminal contact portions, the third power terminal contact portions, and the fourth power terminal contact portions; and a second contact connector including a horizontal connection portion lying partially at a different height from the first power terminal contact portions, the second power terminal contact portions, the third power terminal contact portions, and the fourth power terminal contact portions and a vertical connection portion connected to the horizontal connection portion.

According to one embodiment, the number of all terminals including the first power terminals, the second power terminals, the third power terminals, and the fourth power terminals may be 4×n.

According to one embodiment, one of the first LED chip, the second LED chip, and the third LED chip may be a red LED chip, another may be a blue LED chip, and the other may be a green LED chip.

A further aspect of the present invention provides a substrate for a multi-pixel LED package on which n pixel groups (where n is a natural number equal to or greater than 2) are arrayed wherein the substrate includes: a substrate material; a first metal pattern layer formed on the substrate material and including first individual electrodes individually connected to first conductive electrodes of first LED chips in the pixel groups, second individual electrodes individually connected to first conductive electrodes of second LED chips in the pixel groups, third individual electrodes individually connected to first conductive electrodes of third LED chips in the pixel groups, and common electrodes connected in common to second conductive electrodes of the first LED chips, the second LED chips, and the third LED chips in the pixel groups; a passivation layer formed on the substrate material to cover the first metal pattern layer and formed with accommodation portions accommodating the pixels; and a second metal pattern layer formed on the passivation layer, and wherein lines formed in the first metal pattern layer and the second metal pattern layer and vias formed in the passivation layer to form first connectors connected to all of the first individual electrodes in the pixel groups, second connectors connected to all of the second individual electrodes in the pixel groups, third connectors connected to all of the third individual electrodes in the pixel groups, and fourth connectors individually connected to all of the common electrodes in the pixel groups.

According to one embodiment, the substrate material may be a light transmitting material.

According to one embodiment, each of the first connectors, the second connectors, and the third connectors includes a global connection line disposed parallel to the corresponding pixel group along the widthwise direction; and the global connection lines are formed as portions of the first metal pattern layer.

According to one embodiment, each of the first connectors includes a first global connection line disposed along the widthwise direction while being spaced apart from one side of the corresponding pixel group and first local connection lines connecting the first individual electrodes in the corresponding pixel group to the first global connection line; each of the second connectors includes a second global connection line disposed along the widthwise direction while being spaced apart from the other side of the corresponding pixel group and second local connection lines connecting the second individual electrodes in the corresponding pixel group to the second global connection line; each of the third connectors includes a third global connection line disposed along the widthwise direction and arranged to face the corresponding pixel group through the second global connection line and third local connection lines connecting the third individual electrodes in the corresponding pixel group to the third global connection line; the first global connection lines, the second global connection lines, the third global connection lines, the first local connection lines, and the second local connection lines are formed as portions of the first metal pattern layer; and each of the third local connection lines includes a horizontal line portion formed as a portion of the second metal pattern layer and a vertical line portion penetrating the passivation layer to connect the horizontal line portion to the third global connection line.

According to one embodiment, the fourth connectors include global connection lines formed as portions of the first metal pattern layer or the second metal pattern layer along the lengthwise direction and local connection lines connecting the n common electrodes arrayed along the columns of the corresponding pixels to the corresponding global connection lines.

According to one embodiment, the fourth connectors include n−1 fourth connectors whose global connection lines are formed as portions of the second metal pattern layer and a single fourth connector whose global connection line is formed as a portion of the first metal pattern layer; and the single fourth connector is located in the first or $n^{th}$ column.

According to one embodiment, each of the n−1 fourth connectors further includes local lines vertically extending from the second metal pattern layer to the first metal pattern layer and the single fourth connector further includes local lines formed as portions of the first metal pattern layer.

According to one embodiment, the global connection line of the single fourth connector lies in the same plane as the local connection lines.

According to one embodiment, each of the common electrodes includes a stem and a first branch, a second branch, and a third branch diverging from the stem; the second conductive electrodes of the first LED chips, the second LED chips, and the third LED chips are bonded to the first branches, the second branches, and the third branches, respectively; and the local connection lines as portions of the corresponding fourth connector are connected to the stems.

According to one embodiment, the first metal pattern layer further includes first power terminal contact portions, second power terminal contact portions, third power terminal contact portions, and fourth power terminal contact portions in contact with first power terminals, second power terminals, third power terminals, and fourth power terminals, respectively.

According to one embodiment, the first power terminal contact portions, the second power terminal contact portions, the third power terminal contact portions, and the fourth power terminal contact portions are connected to the first global connection lines, the second global connection lines, the third global connection lines, and the fourth global connection lines through contact connectors, respectively; and each of the contact connectors includes a first contact connector as a horizontal connection portion formed in the first metal pattern layer and a second contact connector including a horizontal connection portion formed in the second metal pattern layer and a vertical connection portion connected to the horizontal connection portion.

According to one embodiment, the passivation layer has openings through which the first power terminals, the second power terminals, the third power terminals, and the fourth power terminals are exposed.

Another aspect of the present invention provides a multi-pixel LED package including: n pixel groups (where n is a natural number equal to or greater than 2), each of which includes a plurality of pixels, each of which includes a first LED chip, a second LED chip, and a third LED chip; and a substrate on which the n pixel groups are arrayed, wherein the substrate includes first individual electrodes individually connected to first conductive electrodes of the first LED chips in the pixel groups, second individual electrodes individually connected to first conductive electrodes of the second LED chips in the pixel groups, third individual electrodes individually connected to first conductive electrodes of the third LED chips in the pixel groups, common electrodes connected in common to second conductive electrodes of the first LED chips, the second LED chips, and the third LED chips in the pixel groups, first connectors connected to all of the first individual electrodes in the pixel groups, second connectors connected to all of the second individual electrodes in the pixel groups, third connectors connected to all of the third individual electrodes in the pixel groups, fourth connectors individually connected to all of the common electrodes in the pixel groups, first power terminals individually connected to the first connectors, second power terminals individually connected to the second connectors, third power terminals individually connected to the third connectors, and fourth power terminals individually connected to the fourth connectors; and the substrate is based on a light transmitting substrate material through which light emitted from the first LED chips, the second LED chips, and the third LED chips is allowed to pass.

According to one embodiment, the first individual electrodes, the second individual electrodes, the third individual electrodes, and the common electrodes are disposed on the light transmitting substrate material.

According to one embodiment, a passivation layer is formed on the substrate material to completely cover the first individual electrodes, the second individual electrodes, the third individual electrodes, and the common electrodes; and accommodation portions are formed in the passivation layer to accommodate the pixels or the first LED chips, the second LED chips, and the third LED chips.

According to one embodiment, the accommodation portions are upwardly closed and are filled with a transparent resin; and the passivation layer is formed using a resin including a reflective or light absorbing material.

According to one embodiment, the passivation layer covers the side surfaces of the first power terminals, the second power terminals, the third power terminals, and the fourth power terminals.

According to one embodiment, the first conductive electrode and the second conductive electrode of each of the first LED chips, the second LED chips, and the third LED chips are disposed opposite to the surface of the LED chip in contact with the light transmitting substrate material; a passivation layer covering the side surfaces of the first LED chips, the second LED chips, and the third LED chips and having openings through which the first conductive electrodes and the second conductive electrodes are exposed is formed on the light transmitting substrate material; a metal pattern layer including the first individual electrodes, the second individual electrodes, the third individual electrodes and the common electrodes is formed on the passivation layer; and the first power terminals, the second power terminals, the third power terminals, and the power terminals are arranged on the metal pattern layer.

According to one embodiment, the multi-pixel LED package further includes an additional passivation layer covering the metal pattern layer and having openings through which the first power terminals, the second power terminals, the third power terminals, and the power terminals are exposed.

Yet another aspect of the present invention provides a multi-pixel LED package including: n pixel groups (where n is a natural number equal to or greater than 2), each of which includes a plurality of pixels, each of which includes a first LED chip, a second LED chip, and a third LED chip; and a substrate on which the n pixel groups are arrayed, wherein the substrate includes first individual electrodes individually connected to first conductive electrodes of the first LED chips in the pixel groups, second individual electrodes individually connected to first conductive electrodes of the second LED chips in the pixel groups, third individual electrodes individually connected to first conductive electrodes of the third LED chips in the pixel groups, common electrodes connected in common to second conductive electrodes of the first LED chips, the second LED chips, and the third LED chips in the pixel groups, first connectors connected to all of the first individual electrodes in the pixel groups, second connectors connected to all of the second individual electrodes in the pixel groups, third connectors connected to all of the third individual electrodes in the pixel groups, fourth connectors individually connected to all of the common electrodes in the pixel groups, first power terminals individually connected to the first connectors, second power terminals individually connected to the second connectors, third power terminals individually connected to the third connectors, and fourth power terminals individually connected to the fourth connectors; all or some of the first individual electrodes, the second individual electrodes, the third individual electrodes, and the common electrodes are disposed on one surface of the substrate; a metal pattern layer including connection lines corresponding to all or some of the first individual electrodes, the second individual electrodes, the third individual electrodes, and the common electrodes is formed on the other surface of the substrate; the connection lines are connected to all or some of the first individual electrodes, the second individual electrodes, the third individual electrodes, and the common electrodes through vias penetrating the substrate; and the connection lines of the metal pattern layer are connected to the first power terminals, the second power terminals, the third power terminals, and the fourth power terminals.

Effects of the Invention

The multi-pixel LED packages of the present invention include a plurality of pixels arrayed in a matrix with a plurality of rows and a plurality of columns and a greatly reduced number of terminals per pixel compared to conventional multi-pixel LED packages, achieving a high degree of freedom of circuit design on a substrate. In addition, the multi-pixel LED packages for display modules according to the present invention include a common anode terminal provided to cover other pixels in the same row and a cathode terminal provided to cover LED chips of other pixels in the same column that emit light of the same wavelength. This configuration is advantageous in that the pixels and the LED chips emitting light of different wavelengths in the pixels have fast response and can be individually controlled in a reliable manner. Furthermore, when micro-LED chips are combined into a plurality of pixels, the multi-pixel LED packages of the present invention are free from problems such as limited widths of electrodes and circuit patterns formed on a substrate and connected to drive ICs, complex circuit design, and a difference in voltage between the LED chips by densely packed circuit interconnection lines to cause an optical deviation.

Other objects and advantages of the present invention will be better understood from the following description of embodiments.

BRIEF DESCRIPTION OF THE DRAWINGS

FIG. 1 is a plan view illustrating a multi-pixel LED package according to one embodiment of the present invention, together with the lower portions of virtually invisible LED chips.

FIG. 2 is a plan view illustrating a substrate for a multi-pixel LED package according to one embodiment of the present invention.

FIG. 3 illustrates a configuration for individually driving LED chips of a multi-pixel LED package according to one embodiment of the present invention.

FIG. 4 is a cross-sectional view illustrating the formation of a first metal pattern layer on a light transmitting substrate material in the construction of a multi-pixel LED package according to one embodiment of the present invention.

FIG. 5 is a plan view the pattern of the first metal pattern layer illustrated in FIG. 4.

FIG. 6 is a cross-sectional view illustrating the formation of a passivation layer covering a first metal pattern layer in the construction of a multi-pixel LED package according to one embodiment of the present invention.

FIG. 7 is a plan view the pattern of the passivation layer illustrated in FIG. 6.

FIG. 8 is a cross-sectional view illustrating the formation of a second metal pattern layer on a passivation layer in the construction of a multi-pixel LED package according to one embodiment of the present invention.

FIG. 9 is a plan view the pattern of the second metal pattern layer illustrated in FIG. 8.

FIG. 10 illustrates the formation of an additional layer on the second metal pattern layer illustrated in FIG. 8 to protect the second metal pattern layer.

FIGS. 11 to 13 illustrate other embodiments of the present invention.

BEST MODE FOR CARRYING OUT THE INVENTION

Embodiments of the present invention will now be described with reference to the accompanying drawings.

FIG. 1 is a plan view illustrating a multi-pixel LED package according to one embodiment of the present invention, together with the lower portions of virtually invisible LED chips. FIG. 2 is a plan view illustrating a substrate for the multi-pixel LED package.

As illustrated in FIGS. 1 and 2, the multi-pixel LED package includes n pixel groups PG1, PG2, . . . , PGn (where n is a natural number equal to or greater than 2) and a substrate 100 on which the n pixel groups are arrayed. In this embodiment, n is 8. That is the number of the pixel groups PG1, PG2, . . . , PGn is 8. The pixel groups PG1, PG2, . . . , PGn are arrayed along the lengthwise direction.

Each of the pixel groups PG1, PG2, . . . , PGn includes a plurality of pixels 200, each of which includes a first LED chip 220, a second LED chip 240, and a third LED chip 260. Each of the first LED chip 220, the second LED chip 240, and the third LED chip 260 is preferably a flip-chip type. The first LED chip 220 has a first conductive electrode 222 and a second conductive electrode 224 on one surface thereof. The second LED chip 240 has a first conductive electrode 242 and a second conductive electrode 244 on one surface thereof. The third LED chip 260 has a first conductive electrode 262 and a second conductive electrode 264 on one surface thereof. In this embodiment, the first LED chip 220, the second LED chip 240, and the third LED chip 260 are red, blue, and green LED chips, respectively. Each of the LED chips 220, 240, and 260 is preferably a micro-LED chip whose one side is 200 µm or less long.

As mentioned previously, the n pixel groups are arrayed along the lengthwise direction, the pixels 200 in each of the pixel groups PG1, PG2, . . . , PGn are arrayed along the widthwise direction, and the number of the pixels is n in each of the pixel groups PG1, PG2, . . . , PGn. Since the pixel groups PG1, PG2, . . . , PGn are arrayed in n columns along the lengthwise direction and the number of the pixels 200 arrayed along the widthwise direction in each of the pixel groups is n, as mentioned above, the pixels 200 are arrayed in a matrix with n rows and n columns (n×n). In this embodiment, the pixels 200 are arrayed in a matrix with 8 columns and 8 rows (8×8). That is, the total number of the pixels 200 is 64. Since each of the pixels 200 consists of three LED chips 220, 240, and 260, the total number of the LED chips is 192. The total number of power terminals for individual driving of the LED chips in all pixels is 4×n (32 in this embodiment). The power terminals include n first power terminals 191 corresponding to the first conductive electrodes of the first LED chips 220, n second power terminals 192 corresponding to the first conductive electrodes of the second LED chips 240, n third power terminals 193 corresponding to the first conductive electrodes of the third LED chips 260, and n fourth power terminals 194 corresponding to the second conductive electrodes of the first LED chips 220, the second LED chips 240, and the third LED chips 260.

The substrate 100 includes first individual electrodes 120 connected to the first conductive electrodes 222 of the first LED chips 220 in the pixel groups, second individual electrodes 140 individually connected to the first conductive electrodes 242 of the second LED chips 240 in the pixel groups, third individual electrodes 160 individually connected to the first conductive electrodes 262 of the third LED chips 260 in the pixel groups, and common electrodes 110 connected in common to the second conductive electrodes 224, 244, and 264 of the first LED chips 220, the second LED chips 240, and the third LED chips 260 in the pixel groups.

Each of the common electrodes 110 includes a stem 111 and a first branch 112, a second branch 114, and a third branch 116 diverging from the stem 111. The second conductive electrodes 224, 244, and 264 of the first LED chip 220, the second LED chip 240, and the third LED chip 260 are bonded to the first branch 112, the second branch 114, and the third branch 116, respectively. Each of the first branch 112, the second branch 114, and the third branch 116 includes an enlarged area to which the second conductive electrodes 224, 244, and 264 can be bonded over a large area and a narrow portion through which the enlarged area is connected to the stem 111.

The substrate 100 includes first connectors 130, second connectors 150, third connectors 170, fourth connectors 180a and 180b, first power terminals 191 corresponding to the first connectors 130, second power terminals 192 corresponding to the second connectors 150, third power terminals 193 corresponding to the third connectors 170, and fourth power terminals 194 corresponding to the fourth connectors 180a and 180b.

The first connectors 130 are connected to all of the first individual electrodes 120 in the pixel groups, the second connectors 150 are connected to all of the second individual electrodes 140 in the pixel groups, the third connectors 170 are connected to all of the third individual electrodes 160 in the pixel groups, and the fourth connectors 180a and 180b are individually connected to all of the common electrodes 110 in the pixel groups.

The first power terminals 191 are connected to the first connectors 130 while being in contact with first power terminal contact portions 139 as portions of the first connectors 130, the second power terminals 192 are connected to the second connectors 150 while being in contact with second power terminal contact portions 159 as portions of the second connectors 150, the third power terminals 193 are connected to the third connectors 170 while being in contact with third power terminal contact portions 179 as portions of the third connectors 170, and the fourth power terminals 194 are connected to the fourth connectors 180a and 180b while being in contact with fourth power terminal contact portions 189 as portions of the fourth connectors 180a and 180b.

In this embodiment, each of the first connectors 130 includes a global connection line 131 parallel to the corresponding pixel group along the widthwise direction and local connection lines 132 connecting the individual electrodes in the corresponding pixel group to the corresponding global connection line 131; each of the second connectors 150 includes a global connection line 151 parallel to the corresponding pixel group along the widthwise direction and local connection lines 152 connecting the individual electrodes in the corresponding pixel group to the corresponding global connection line 151; and each of the third connectors 170 includes a global connection line 171 parallel to the corresponding pixel group along the widthwise direction and local connection lines 172 connecting the individual electrodes in the corresponding pixel group to the corresponding global connection line 171.

The first global connection line 131 of each of the first connectors 130 is disposed along the widthwise direction while being spaced apart from one side of the corresponding pixel group PG1, PG2, . . . , or PGn and the first local connection lines 132 of each of the first connectors 130 connect the first individual electrodes 120 in the corresponding pixel group PG1, PG2, . . . , or PGn to the first global connection line 131. The second global connection line 151 of each of the second connectors 150 is disposed along the widthwise direction while being spaced apart from the other side of the corresponding pixel group and the second local connection lines 152 of each of the second connectors 150 connect the second individual electrodes 140 in the corresponding pixel group to the second global connection line 151. The third global connection line 171 of each of the third connectors 170 is disposed along the widthwise direction and arranged to face the corresponding pixel group through the second global connection line 151 and the third local connection lines 172 of each of the third connectors 170 connect the third individual electrodes 160 in the corresponding pixel group to the third global connection line 172.

The first global connection line 131 and the first local connection lines 132 lie in the same plane as the first individual electrodes 120, and the second global connection line 151 and the second local connection lines 152 lie in the same plane as the second individual electrodes 140. Furthermore, the first global connection line 131 and the first local connection lines 132 lie in the same plane as the first individual electrodes 112; the second global connection line 151 and the second local connection lines 152 lie in the same plane as the second individual electrodes 114; the third global connection line 171 lies in the same plane as the third individual electrodes 116; and the third local connection lines 172 include horizontal line portions traversing the second global connection lines 151 at a different height from the third individual electrodes 116 and vertical line portions individually connecting the horizontal line portions to the third individual electrodes and the third local connection lines.

The fourth connectors 180a and 180b include global connection lines 181a and 18ab disposed along the lengthwise direction and local connection lines connecting the n common electrodes 110 arrayed along the columns of the corresponding pixels to the corresponding global connection lines 181a and 181b. The number of the fourth connectors 180a is n−1. The global connection lines of the fourth connectors 180a are disposed at a different height from the common electrodes 110. The global connection line of the single fourth connector 180b lies in the same plane as the common electrodes 110. The single fourth connector 180b is located in the first or $n^{th}$ column. In this embodiment, the global connection lines in the first column to the $(n-1)^{th}$ column are disposed at a different height as the common electrodes 110 and only the global connection line in the $n^{th}$ column is disposed at the same height as the common electrodes 110. Thus, each of the n−1 fourth connectors 180a includes local lines vertically extending from the global connection line 181a at a different height from the common electrodes 110 to the common electrodes 110. In contrast, the global connection line 181b of the single fourth connector 180b lies in the same plane as the common electrodes 110. Particularly, each of the common electrodes 110 corresponding to the global connection line 181b of the single fourth connector 180b includes a first branch 112, a second branch 114, and a third branch 116 to which the second conductive electrodes 244 of the first LED chip 220, the second LED chip 240, and the third LED chip 260 are bonded, respectively, and a stem 111 at which the first branch 112, the second branch 114, and the third branch 116 merge. The stem 111 is integrated as a portion of the global connection line 181b of the single fourth connector.

The stems 111 integrated as portions of the global connection line 181b are in practice not visually distinguished from the global connection line 181b, but it should be noted that the stems 111 are denoted by lines to distinguish their regions from the other regions of the global connection line 181b for ease of illustration in FIG. 2.

The global connection lines 181a of the n−1 fourth connectors 180a are formed at a different height from the common electrodes 110 and the local connection lines (i.e. vias) vertically extending from the global connection lines 181 connect the global connection lines 181a to the stems 111 of the corresponding common electrodes 110. The first branches 112, the second branches 114, and the third branches 116 diverge from the stems 111.

The first power terminal contact portions 139, the second power terminal contact portions 159, the third power terminal contact portions 179, and the fourth power terminal contact portions 189 are provided as portions of the first connectors 130, the second connectors 150, the third connectors 170, and the fourth connectors 180a or 180b, respectively. The first power terminal contact portions 139, the second power terminal contact portions 159, the third power terminal contact portions 179, and the fourth power terminal contact portions 189 are connected to the first global connection lines 131, the second global connection lines 151, the third global connection lines 171, and the fourth global connection lines 181a or 181b through contact connectors c1, c2, c3, and c4, respectively.

The first power terminals 191, the second power terminal 192, the third power terminals 193, and the fourth power terminals 194 are connected to the first connectors 130, the second connectors 150, the third connectors 170, and the fourth connectors 180 while being in contact with the first power terminal contact portions 139, the second power terminal contact portions 159, the third power terminal contact portions 179, and the fourth power terminal contact portions 189, respectively. The 4n power terminals including the first power terminals 191, the second power terminals 192, the third power terminals 193, and the fourth power terminals 194 can be used to individually control all 3×n×n LED chips in the n×n pixels.

The first power terminal contact portions 139, the second power terminal contact portions 159, the third power terminal contact portions 179, and the fourth power terminal contact portions 189 lie in the same plane as the first global connection lines 131, the second global connection lines 151, and the third global connection lines 171; and at least one of the fourth global connection lines 181a and 181b is at a different height from the fourth power terminal contact portions 189.

Each of the contact connectors c1, c2, c3, and c4 may include: a first contact connector as a horizontal connection portions lying entirely in the same plane as the first power terminal contact portions 139, the second power terminal contact portions 159, the third power terminal contact portions 179, and the fourth power terminal contact portions 189; and a second contact connector including a horizontal connection portion lying partially at a different height from the first power terminal contact portions 139, the second power terminal contact portions 159, the third power terminal contact portions 179, and the fourth power terminal contact portions 189 and a vertical connection portion connected to the horizontal connection portion.

As mentioned earlier, the number of all power terminals including the first power terminals 191, the second power terminals 192, the third power terminals 193, and the fourth power terminals 194 in the multi-pixel LED package including the pixels arrayed in a matrix with n rows and n columns is 4×n. One of the first LED chip 220, the second LED chip 240, and the third LED chip 260 may be a red LED chip, another may be a blue LED chip, and the other may be a green LED chip. Accordingly, one of the first power terminal 191, the second power terminal 192, and the third power terminal 193 may be an R individual power terminal corresponding to the first conductive electrode of the red LED chip, another may be a B individual power terminal corresponding to the first conductive electrode of the blue LED chip, and the other may be a G individual power terminal corresponding to the first conductive electrode of the green LED chip. The fourth power terminal may be a common power terminal corresponding to the second conductive electrodes of the red LED chip, the green LED chip, and the blue LED chip.

FIG. 3 illustrates an array of the LED chips in the multi-pixel LED package. Referring to FIG. 3, the numbers of the power terminals necessary to individually drive the 192 LED chips in the 8×8 pixels are 8 for the R power terminals R1, R2, ..., R8, 8 for the G power terminals G1, G2, ..., G8, 8 for the B power terminals G1, G2, ..., G8, and 8 for the common power terminals A1, A2, ..., A8.

The substrate for the multi-pixel LED package and a method for preparing the substrate are sequentially described in the following.

First, a first metal pattern layer 102 is formed on one surface of a light transmitting substrate material, more specifically a transparent substrate material 101 such as sapphire, as illustrated in FIGS. 4 and 5.

The first metal pattern layer 102 is formed by forming a mask layer on one surface of the transparent substrate material 101 and depositing one or more metals thereon. Alternatively, the first metal pattern layer 102 may be formed by depositing one or more metals over one surface of the transparent substrate material 101 to form a metal layer and etching the metal layer through a mask. The transparent substrate material 101 is preferably treated with an $O_2$ plasma before the metal deposition. This plasma treatment is performed to remove photosensitive polyimide (PSPI) residues and enhance the adhesive strength between the transparent substrate material 101 and the metals to be deposited. The metal pattern layer 102 includes a laminate structure of the metals, for example, a metal laminate structure of Ni/Al/Ti/Al, more preferably a 1.4 μm thick laminate structure consisting of a 0.1 μm thick Ni layer, a 0.7 μm thick Al layer, a 0.1 μm thick Ti layer, and a 0.5 μm thick Al layer. Here, the 0.1 μm thick Ni layer is in contact with the substrate material 101 to enhance the adhesive strength between the substrate material 101 and the first metal pattern layer 102.

As well illustrated in FIG. 5, the first metal pattern layer 102 includes electrode patterns in n rows and n columns corresponding to pixels arrayed in a matrix with n rows and n columns. Each of the electrode patterns includes a first individual electrode 120 to which a first conductive electrode 222 of a first LED chip (see FIG. 1) is bonded, a second individual electrode 140 to which a first conductive electrode 242 of a second LED chip is bonded, a third individual electrode 160 to which a first conductive electrode 262 of a third LED chip is bonded, and a common electrode 110 to which second conductive electrodes 224, 244, and 264 of the first LED chip, the second LED chip, and the third LED chip are bonded. As mentioned above, the pixels are grouped into a plurality of pixel groups, which are arrayed along the lengthwise direction. In each of the pixel groups, the pixels are arrayed in a row along the widthwise direction. Accordingly, in the first metal pattern layer 102, the first individual electrodes 120 are individually connected to the first conductive electrodes 222 of the first LED chips in the pixel groups, the second individual electrodes 140 are individually connected to the first conductive electrodes 242 of the second LED chips in the pixel groups, the third individual electrodes 160 are individually connected to the first conductive electrodes 262 of the third LED chips in the pixel groups, and the common electrodes 110 are connected in common to the second conductive electrodes 224, 244, and 264 of the first LED chips, the second LED chips, and the third LED chips in the pixel groups.

Next, an electrically insulating passivation layer 103 is formed on the substrate material 101 to cover the first metal pattern layer 102, as illustrated in FIGS. 4, 5, 6, and 7. Here, accommodation portions 1301 are formed in the passivation layer 103 to accommodate the pixels 200 (see FIG. 1). In this embodiment, each of the accommodation portions 1301 is upwardly open. Via holes 1302 are formed in the passivation layer 103. The upwardly open accommodation portions 1301 and the via holes 1302 are formed by lithography using photosensitive polyimide (PSPI). After curing, PSPI forms inclined planes in the open accommodation portions 1301 and the via holes due to its tendency to shrink. The inclined planes facilitate subsequent metal deposition thereon. Curing at 320° C. may cause oxidation of the metals but the electrical properties of the metals are maintained. The metals are filled in the via holes to form vias.

Next, a second metal pattern layer 104 is formed on the passivation layer 103, as illustrated in FIGS. 4, 5, 6, 7, 8, and 9. The second metal pattern layer 104 is formed by forming a mask layer on the passivation layer 103 and depositing one or more metals thereon. Alternatively, the second metal pattern layer 104 may be formed by depositing one or more metals over one surface of the passivation layer 103 to form a metal layer and etching the metal layer through a mask. In this embodiment, the metal deposition forms metal vias 105 filling the via holes together with the second metal pattern layer 104. The transparent substrate material 101 is preferably treated with an $O_2$ plasma before the metal deposition. This plasma treatment is performed to remove PSPI residues and enhance the adhesive strength between the passivation layer 103 and the metals to be deposited. The metal layer including the second metal pattern layer 104 and the vias includes a laminate structure of the metals, for example, a metal laminate structure of Ni/Al/Ti/Al, more preferably a 1.4 μm thick laminate structure consisting of a 0.1 μm thick Ni layer, a 0.7 μm thick Al layer, a 0.1 μm thick Ti layer, and a 0.5 μm thick Al layer. Here, the 0.1 μm thick Ni layer is in contact with the passivation layer 103 to enhance the adhesive strength of the metals to the passivation layer 103.

Lines 131, 132, 151, 152, 171, 172, 181a, 181b, 182a, and 182b formed in the first and second metal pattern layers 102 and 104 and the vias integrated with the second metal pattern layer 104 while penetrating the passivation layer 103 may form first connectors 130 (see FIGS. 1 and 2) connected to all of the first individual electrodes 120 in the pixel groups PG1, PG2, ..., PGn, second connectors 150 connected to all of the second individual electrodes 140 in the pixel groups PG1, PG2, ..., PGn, third connectors 170 connected to all of the third individual electrodes 160 in the pixel groups PG1, PG2, ..., PGn, and fourth connectors 180a and 180b individually connected to all of the common electrodes 110 in the pixel groups, as illustrated in FIGS. 1, 2, 5, 7, and 9.

Each of the first connectors 130 includes a global connection line 131 formed parallel to the corresponding pixel group PG1, PG2, ..., or PGn along the widthwise direction. Each of the second connectors 150 includes a global connection line 151 formed parallel to the corresponding pixel group PG1, PG2, ..., or PGn along the widthwise direction. Each of the third connectors 170 includes a global connection line 171 formed parallel to the corresponding pixel group PG1, PG2, ..., or PGn along the widthwise direction. The global connection lines 131, 151, and 171 may be formed as portions of the first metal pattern layer 101.

Each of the first global connection lines 131 is disposed along the widthwise direction while being spaced apart from one side of the corresponding pixel group PG1, PG2, ..., PGn. The first local connection lines 132 connect the first individual electrodes 120 in the corresponding pixel group PG1, PG2, . . . , or PGn to the first global connection line 131. Each of the second global connection lines 151 is disposed along the widthwise direction while being spaced apart from the other side of the corresponding pixel group PG1, PG2, . . . , or PGn. The second local connection lines 152 connect the second individual electrodes 140 in the corresponding pixel group PG1, PG2, . . . , or PGn to the second global connection line 151. Each of the third global connection lines 171 is disposed along the widthwise direction and is arranged to face the corresponding pixel group through the second global connection line 151. The third local connection lines 172 connect the third individual electrodes 160 in the corresponding pixel group PG1, PG2, . . . , or PGn to the third global connection line 171.

Here, each of the first global connection lines 131, the second global connection lines 151, the third global connection lines 171, the local connection lines 132, and the second local connection lines 171 is formed as a portion of the first metal pattern layer 102. Each of the third local connection lines 172 includes a horizontal line portion 1711 formed as a portion of the second metal pattern layer 104 and a vertical line portion 1712 penetrating the passivation layer 103 to connect the horizontal line portion 1711 to the third global connection line 171. The vertical line portions 1712 may be some of the vias.

The global connection lines 181b or 181a are disposed along the lengthwise direction and are formed as portions of the first metal pattern layer 102 or the second metal pattern layer 104. The local connection lines 182b or 182a connect the n common electrodes 110 arrayed along the columns of the corresponding pixels to the corresponding global connection lines 181b or 181a. More specifically, the fourth connectors 180a or 180b include n−1 fourth connectors 180a whose global connection lines 181a are formed as portions of the second metal pattern layer 104 and a single fourth connector 180b whose global connection line 181a is formed as a portion of the first metal pattern layer 102. The single fourth connector 180b is located in the first or $n^{th}$ column. In this embodiment, the single fourth connector 180b is located in the $n^{th}$ column. However, it is also contemplated that the single fourth connector 180b can be located in the first column.

The local lines 182a vertically extend from the global connection lines 181a formed as portions of the second metal pattern layer 104 to the first metal pattern layer 102 and are connected to the common electrodes as portions of the first metal pattern layer 102. In contrast, the local lines 182b are formed as portions of the first metal pattern layer 102 and lie in the same plane as the global connection line 181b.

Each of the common electrodes 110 formed as portions of the first metal pattern layer 102 includes a stem 111 and a first branch 112, a second branch 114, and a third branch 116 diverging from the stem 111. The second conductive electrodes 224, 244, and 264 of the first LED chip, the second LED chip, and the third LED chip are bonded to the first branch 112, the second branch 114, and the third branch 116, respectively. The local connection lines 182a or 182 as portions of the corresponding fourth connector 180a or 180b are connected to the stem 111.

The first metal pattern layer 102 further includes first power terminal contact portions 139, second power terminal contact portions 159, third power terminal contact portions 179, and fourth power terminal contact portions 189 in contact with first power terminals 191, second power terminals 192, third power terminals 193, and fourth power terminals 194, respectively.

The first power terminal contact portions 139, the second power terminal contact portions 159, the third power terminal contact portions 179, and the fourth power terminal contact portions 189 are connected to the first global connection lines 131, the second global connection lines 151, the third global connection lines 171, and the fourth global connection lines 181a or 181b through contact connectors, respectively. Each of the contact connectors includes a first contact connector as a horizontal connection portion formed in the first metal pattern layer 102 and a second contact connector including a horizontal connection portion formed in the second metal pattern layer 104 and a vertical connection portion connected to the horizontal connection portion.

The passivation layer 103 has openings 1033 through which the first power terminals 191, the second power terminals 192, the third power terminals 193, and the fourth power terminals 194 are exposed.

Then, the first, second, and third LED chips 220, 240, and 260 (hereinafter collectively denoted by reference numeral 2000) and the first, second, third, and fourth power terminals 191, 192, 193, and 194 (hereinafter collectively denoted by reference numeral 1900) are mounted on the substrate, as illustrated in FIG. 10. Here, the LED chips 2000 are inserted into the upwardly open accommodation portions 1301 (see FIG. 8) formed in the passivation layer 103.

Referring to both FIG. 1 and FIG. 10, the first conductive electrodes 222 of the first LED chips 220 are bonded to the first individual electrodes 120 and the second conductive electrodes 224 of the first LED chips 220 are bonded to the common electrodes 110. The first conductive electrodes 242 of the second LED chips 240 are bonded to the second individual electrodes 140 and the second conductive electrodes 244 of the second LED chips 240 are bonded to the common electrodes 110. The first conductive electrodes 262 of the third LED chips 260 are bonded to the third individual electrodes 160 and the second conductive electrodes 264 of the third LED chips 260 are bonded to the common electrodes 110.

After the mounting of the LED chips 2000 is completed, the LED chips 2000 are embedded in a silicone resin 4000 such that the LED chips 2000 are protected against external impacts. The power terminals 1900 are exposed through the openings. After bonding of the LED chips, the substrate may be cut by scribing. Alternatively, scribing may be performed before bonding of the LED chips.

Various processes can be considered to mount LED chips on substrates for multi-pixel LED packages. Some exemplary processes are illustrated in FIGS. 11, 12, and 13.

FIG. 11 illustrates a process using a substrate based on a transparent substrate material 100 in the same manner as described in the previous embodiment. As in the previous embodiment, a first metal pattern layer 102 including first individual electrodes, second individual electrodes, third individual electrodes, and common electrodes is formed on a light transmitting substrate material 101; a passivation layer 103 is formed on the substrate material to cover all of the first individual electrodes, the second individual electrodes, the third individual electrodes, and the common electrodes;

accommodation portions accommodating pixels or LED chips 2000, which may be first LED chips, second LED chips, and third LED chips, are formed in the passivation layer 103; the accommodation portions are upwardly closed; the accommodation portions are filled with a transparent resin 108; and the passivation layer 103 is formed using a resin including a reflective or light absorbing material. Although not illustrated, the passivation layer 103 is formed so as to cover the side surfaces of first power terminals, second power terminals, third power terminals, and fourth power terminals.

FIG. 12 illustrates another exemplary process. First, LED chips 2000 are prepared. The LED chips 2000 may be first, second, and third LED chips, as in the foregoing embodiments. Referring to FIG. 12, a first conductive electrode 2001 and a second conductive electrode 2002 of each of the LED chips 2000 are disposed opposite to the surface of the LED chip in contact with a light transmitting substrate material 101; a passivation layer 103a covering the side surfaces of the LED chips 2000 and having accommodation portions (i.e. openings 1031a) through which the first conductive electrodes 2001 and the second conductive electrodes 2002 are exposed is formed on the light transmitting substrate material 101; a first metal pattern layer 102 including individual electrodes 1001 including first, second, and third individual electrodes and common electrodes 1002 is formed on the passivation layer 103a; and the first metal pattern layer 102 includes terminal contact portions in which first power terminals, second power terminals, and third power terminals as anode power terminals 1901 are arranged and terminal contact portions in which fourth power terminals are arranged as cathode terminals 1902.

An additional passivation layer 105 is provided to cover the first metal pattern layer 102 and openings are formed in the additional passivation layer 105 to expose the terminals therethrough. Although not illustrated, a second metal pattern layer is formed on the additional passivation layer 105. The second metal pattern layer together with portions of the first metal pattern layer 102 forms a plurality of connectors. The connectors are connected to the power terminals to individually drive the LED chips.

FIG. 13 illustrates a multi-pixel LED package according to another embodiment of the present invention.

Main elements of the multi-pixel LED package according to this embodiment are substantially the same as those of the LED multi-pixel LED package illustrated in FIGS. 1 and 2. With reference to FIG. 13 together with FIGS. 1 and 2, this embodiment will be described below.

As in the foregoing embodiments, the multi-pixel LED package according to this embodiment includes n pixel groups PG1, PG2, . . . , PGn (where n is a natural number equal to or greater than 2) and a substrate 100 on which the n pixel groups PG1, PG2, . . . , PGn are arrayed wherein each of the pixel groups PG1, PG2, . . . , PGn includes a plurality of pixels 200, each of which includes first, second, and third LED chips 220, 240, and 260 (hereinafter collectively denoted by reference numeral 2000). The substrate 100 includes first individual electrodes 120 individually connected to first conductive electrodes 222 of the first LED chips 220 in the pixel groups, second individual electrodes 140 individually connected to first conductive electrodes 242 of the second LED chips 240 in the pixel groups, third individual electrodes 160 individually connected to first conductive electrodes 262 of the third LED chips 260 in the pixel groups, common electrodes 110 connected in common to second conductive electrodes 224, 244, and 264 (hereinafter collectively denoted by reference numeral 2000) of the first LED chips 220, the second LED chips 240, and the third LED chips 260 in the pixel groups, first connectors 130 connected to all of the first individual electrodes 120 in the pixel groups, second connectors 150 connected to all of the second individual electrodes 140 in the pixel groups, third connectors 170 connected to all of the third individual electrodes 160 in the pixel groups, and fourth connectors 180a and 180b individually connected to all of the common electrodes 110 in the pixel groups, first power terminals 191 individually connected to the first connectors 130, second power terminals 192 individually connected to the second connectors 150, third power terminals 193 individually connected to the third connectors 170, and fourth power terminals 194 individually connected to the fourth connectors 180a or 180b.

As best illustrated in FIG. 13, the substrate 100 includes a substrate material 101; a first metal pattern layer 102 including all or some of the first individual electrodes, the second individual electrodes, the third individual electrodes, and the common electrodes is formed on one surface of the substrate material 101; a second metal pattern layer 103 including connection lines corresponding to all or some of the first individual electrodes, the second individual electrodes, the third individual electrodes, and the common electrodes is formed on the other surface of the substrate material 101; the connection lines are connected to all or some of the first individual electrodes, the second individual electrodes, the third individual electrodes, and the common electrodes through vias 105 penetrating the substrate material 101; and the connection lines of the second metal pattern layer are connected to the first power terminals, the second power terminals, the third power terminals, and the fourth power terminals. The LED chips 2000 are provided such that the first conductive electrodes 2001 and the second conductive electrodes 2002 face the first metal pattern layer 102. The first conductive electrodes 2001 are bonded to the first, second or third individual electrodes as portions of the first metal pattern layer 102 and the second conductive electrodes 2002 are bonded to the common electrodes as other portions of the first metal pattern layer 102. Thereby, the LED chips 2000 emit light in a direction opposite to the direction toward the substrate 100 while being suspended from and supported by the substrate 100.

Although not described in detail above, it is noted that the wavelengths of light emitted from the first, second, and third LED chips can also be determined only by components of compound semiconductors and can be converted by phosphors or quantum dots.

Although not illustrated, barriers may be disposed between the pixels to isolate the pixels for the purpose of preventing mixing of light from the pixels.

The first, second, and/or third LED chips include a first conductive semiconductor layer, an active layer, and a second conductive semiconductor layer formed in this order on one surface of the growth substrate in one direction. Preferably, the first, second, and/or third LED chips have a flip-chip structure in which a first conductive semiconductor layer and a second conductive semiconductor layer are stepped with respect to each other and are exposed downward while interposing an active layer therebetween. It is noted that the first, second, and/or third LED chips may have a wire-bonding structure in which wires are bonded to first and/or second conductive electrodes, rather than a flip-chip structure. In this case, first conductive electrodes are disposed on the first conductive semiconductor layer and second conductive electrodes are disposed on the second conductive semiconductor layer.

EXPLANATION OF REFERENCE NUMERALS

PG1, PG2, . . . , PGn; Pixel groups
200: Pixel
191, 192, 193, 194: Power terminals
130, 140, 150, 170, 180a, 180b: Connectors
100: Substrate
220, 240, 260, 2000: LED chips

The invention claimed is:

1. A substrate for a multi-pixel LED package on which n pixel groups (where n is a natural number equal to or greater than 2) are arrayed, wherein the substrate comprises:
a substrate material;
a first metal pattern layer formed on the substrate material and comprising
first individual electrodes individually connected to first conductive electrodes of first LED chips in the pixel groups,
second individual electrodes individually connected to first conductive electrodes of second LED chips in the pixel groups,
third individual electrodes individually connected to first conductive electrodes of third LED chips in the pixel groups, and
common electrodes connected in common to second conductive electrodes of the first LED chips, the second LED chips, and the third LED chips in the pixel groups;
a passivation layer formed on the substrate material to cover the first metal pattern layer and formed with accommodation portions accommodating the pixels; and
a second metal pattern layer formed on the passivation layer,
wherein lines formed in the first metal pattern layer and the second metal pattern layer and vias formed in the passivation layer form first connectors each connected to all of the first individual electrodes corresponding to the first conductive electrodes of the first LED chips in the pixel groups, second connectors each connected to all of the second individual electrodes corresponding to the first conductive electrodes of the second LED chips in the pixel groups, third connectors each connected to all of the third individual electrodes corresponding to the first conductive electrodes of the third LED chips in the pixel groups, and fourth connectors connected to the common electrodes corresponding to the second conductive electrodes of the first, second, and third LED chips in the pixel groups, and
wherein the first metal pattern layer further comprises first power terminal contact portions, second power terminal contact portions, third power terminal contact portions, and fourth power terminal contact portions in contact with first power terminals, second power terminals, third power terminals, and fourth power terminals, respectively.

2. The substrate according to claim 1, wherein the passivation layer has openings through which the first power terminals, the second power terminals, the third power terminals, and the fourth power terminals are exposed.

3. A substrate for a multi-pixel LED package on which n pixel groups (where n is a natural number equal to or greater than 2) are arrayed, wherein the substrate comprises:
a substrate material;
a first metal pattern layer formed on the substrate material and comprising
first individual electrodes individually connected to first conductive electrodes of first LED chips in the pixel groups,
second individual electrodes individually connected to first conductive electrodes of second LED chips in the pixel groups,
third individual electrodes individually connected to first conductive electrodes of third LED chips in the pixel groups, and
common electrodes connected in common to second conductive electrodes of the first LED chips, the second LED chips, and the third LED chips in the pixel groups;
a passivation layer formed on the substrate material to cover the first metal pattern layer and formed with accommodation portions accommodating the pixels; and
a second metal pattern layer formed on the passivation layer, and
wherein lines formed in the first metal pattern layer and the second metal pattern layer and vias formed in the passivation layer form first connectors each connected to all of the first individual electrodes corresponding to the first conductive electrodes of the first LED chips in each of the pixel groups, second connectors each connected to all of the second individual electrodes corresponding to the first conductive electrodes of the second LED chips in each of the pixel groups, third connectors each connected to all of the third individual electrodes corresponding to the first conductive electrodes of the third LED chips in each of the pixel groups, and fourth connectors connected to the common electrodes corresponding to the second conductive electrodes of the first, second, and third LED chips in the pixel groups,
wherein the fourth connectors comprise global connection lines formed as portions of the first metal pattern layer or the second metal pattern layer along the lengthwise direction and local connection lines connecting the n common electrodes arrayed along the columns of the corresponding pixels to the corresponding global connection lines, and
wherein the fourth connectors comprise n−1 fourth connectors whose global connection lines are formed as portions of the second metal pattern layer and a single fourth connector whose global connection line is formed as a portion of the first metal pattern layer; and the single fourth connector is located in the first or $n^{th}$ column.

4. The substrate according to claim 3, wherein the substrate material is a light transmitting material.

5. The substrate according to claim 3, wherein each of the first connectors, the second connectors, and the third connectors comprises a global connection line disposed parallel to the corresponding pixel group along the widthwise direction; and the global connection lines are formed as portions of the first metal pattern layer.

6. The substrate according to claim 3, wherein each of the first connectors comprises a first global connection line disposed along the widthwise direction while being spaced apart from one side of the corresponding pixel group and first local connection lines connecting the first individual electrodes in the corresponding pixel group to the first global connection line; each of the second connectors comprises a second global connection line disposed along the widthwise direction while being spaced apart from the other side of the corresponding pixel group and second local connection lines connecting the second individual electrodes in the corresponding pixel group to the second global connection line; each of the third connectors comprises a third global connection line disposed along the widthwise direction and arranged to face the corresponding pixel group through the second global connection line and third local connection lines connecting the third individual electrodes in the corresponding pixel group to the third global connection line; the first global connection lines, the second global connection lines, the third global connection lines, the first local connection lines, and the second local connection lines are formed as portions of the first metal pattern layer; and each of the third local connection lines comprises a horizontal line portion formed as a portion of the second metal pattern layer and a vertical line portion penetrating the passivation layer to connect the horizontal line portion to the third global connection line.

7. The substrate according to claim 3, wherein the fourth connectors comprise global connection lines formed as portions of the first metal pattern layer or the second metal pattern layer along the lengthwise direction and local connection lines connecting the n common electrodes arrayed along the columns of the corresponding pixels to the corresponding global connection lines.

8. The substrate according to claim 3, wherein each of the n−1 fourth connectors further comprises local lines vertically extending from the second metal pattern layer to the first metal pattern layer and the single fourth connector further comprises local lines formed as portions of the first metal pattern layer.

9. The substrate according to claim 3, wherein the global connection line of the single fourth connector lies in the same plane as the local connection lines.

10. The substrate according to claim 3, wherein each of the common electrodes comprises a stem and a first branch, a second branch, and a third branch diverging from the stem; the second conductive electrodes of the first LED chips, the second LED chips, and the third LED chips are bonded to the first branches, the second branches, and the third branches, respectively; and the local connection lines as portions of the corresponding fourth connector are connected to the stems.

11. The substrate according to claim 10, wherein the first power terminal contact portions, the second power terminal contact portions, the third power terminal contact portions, and the fourth power terminal contact portions are connected to the first global connection lines, the second global connection lines, the third global connection lines, and the fourth global connection lines through contact connectors, respectively; and each of the contact connectors comprises a first contact connector as a horizontal connection portion formed in the first metal pattern layer and a second contact connector comprising a horizontal connection portion formed in the second metal pattern layer and a vertical connection portion connected to the horizontal connection portion.

12. A multi-pixel LED package comprising:
n pixel groups (where n is a natural number equal to or greater than 2), each of which comprises a plurality of pixels, each of which comprises a first LED chip, a second LED chip, and a third LED chip; and
a substrate on which the n pixel groups are arrayed, wherein the substrate comprises first individual electrodes individually connected to first conductive electrodes of the first LED chips in the pixel groups,
second individual electrodes individually connected to first conductive electrodes of the second LED chips in the pixel groups,
third individual electrodes individually connected to first conductive electrodes of the third LED chips in the pixel groups,
common electrodes connected in common to second conductive electrodes of the first LED chips, the second LED chips, and the third LED chips in the pixel groups,
first connectors each connected to all of the first individual electrodes corresponding to the first conductive electrodes of the first LED chips in each of the pixel groups,
second connectors each connected to all of the second individual electrodes corresponding to the first conductive electrodes of the second LED chips in each of the pixel groups,
third connectors each connected to all of the third individual electrodes corresponding to the first conductive electrodes of the third LED chips in each of the pixel groups,
fourth connectors connected to the common electrodes corresponding to the second conductive electrodes of the first, second, and third LED chips in the pixel groups,
first power terminals individually connected to the first connectors,
second power terminals individually connected to the second connectors,
third power terminals individually connected to the third connectors, and
fourth power terminals individually connected to the fourth connectors,
wherein the number of the pixels in each of the pixel groups is n; the pixels are arrayed along the widthwise direction; and the n pixel groups are arrayed in the lengthwise direction,
wherein each of the first connectors comprises a first global connection line disposed along the widthwise direction while being spaced apart from one side of the corresponding pixel group and first local connection lines connecting the first individual electrodes in the corresponding pixel group to the first global connection line; each of the second connectors comprises a second global connection line disposed along the widthwise direction while being spaced apart from the other side of the corresponding pixel group and second local connection lines connecting the second individual electrodes in the corresponding pixel group to the second global connection line; and each of the third connectors comprises a third global connection line disposed along the widthwise direction and arranged to face the corresponding pixel group through the second global connection line and third local connection lines connecting the third individual electrodes in the corresponding pixel group to the third global connection line, and
wherein the first global connection line and the first local connection lines lie in the same plane as the first individual electrodes; and the second global connection line and the second local connection lines lie in the same plane as the second individual electrodes.

13. The multi-pixel LED package according to claim 12, wherein each of the first connectors, the second connectors, and the third connectors comprises a global connection line disposed parallel to the corresponding pixel group along the widthwise direction and local connection lines connecting the individual electrodes in the corresponding pixel group to the corresponding global connection line.

14. The multi-pixel LED package according to claim 12, wherein the first global connection line and the first local connection lines lie in the same plane as the first individual electrodes; the second global connection line and the second local connection lines lie in the same plane as the second individual electrodes; the third global connection line lies in the same plane as the third individual electrodes; and the third local connection lines comprise horizontal line portions traversing the second global connection lines at a different height from the third individual electrodes and vertical line portions individually connecting the horizontal line portions to the third individual electrodes and the third local connection lines.

15. The multi-pixel LED package according to claim 12, wherein the number of all terminals comprising the first power terminals, the second power terminals, the third power terminals, and the fourth power terminals is 4×n.

16. The multi-pixel LED package according to claim 15, wherein one of the first LED chip, the second LED chip, and the third LED chip is a red LED chip, another is a blue LED chip, and the other is a green LED chip.

17. The multi-pixel LED package according to claim 12, wherein first power terminal contact portions, second power terminal contact portions, third power terminal contact portions, and fourth power terminal contact portions are connected to the first global connection lines, the second global connection lines, the third global connection lines, and the fourth global connection lines through contact connectors, respectively; and the first power terminals, the second power terminals, the third power terminals, and the fourth power terminals are connected to the first connectors, the second connectors, the third connectors, and the fourth connectors while being in contact with the first power terminal contact portions, the second power terminal contact portions, the third power terminal contact portions, and the fourth power terminal contact portions, respectively.

18. The multi-pixel LED package according to claim 17, wherein the first power terminal contact portions, the second power terminal contact portions, the third power terminal contact portions, and the fourth power terminal contact portions lie in the same plane as the first global connection lines, the second global connection lines, and the third global connection lines; and at least one of the fourth global connection lines is at a different height from the fourth power terminal contact portions.

19. The multi-pixel LED package according to claim 17, wherein each of the contact connectors comprises: a first contact connector as a horizontal connection portion lying entirely in the same plane as the first power terminal contact portions, the second power terminal contact portions, the third power terminal contact portions, and the fourth power terminal contact portions; and a second contact connector comprising a horizontal connection portion lying partially at a different height from the first power terminal contact portions, the second power terminal contact portions, the third power terminal contact portions, and the fourth power terminal contact portions and a vertical connection portion connected to the horizontal connection portion.

20. The multi-pixel LED package according to claim 12, wherein the fourth connectors comprise global connection lines disposed along the lengthwise direction and local connection lines connecting the n common electrodes arrayed along the columns of the corresponding pixels to the corresponding global connection lines.

21. The multi-pixel LED package according to claim 20, wherein each of the common electrodes comprises a stem connected to one of the local connection lines and a first branch, a second branch, and a third branch diverging from the stem and to which the second conductive electrodes of the first LED chip, the second LED chip, and the third LED chip are bonded, respectively.

22. The multi-pixel LED package according to claim 20, wherein the fourth connectors comprise n−1 fourth connectors whose global connection lines are disposed at a different height from the common electrodes and a single fourth connector whose global connection line lies in the same plane as the common electrodes; and the single fourth connector is located in the first or $n^{th}$ column.

23. The multi-pixel LED package according to claim 22, wherein each of the n−1 fourth connectors comprises local lines vertically extending from the global connection line at a different height from the common electrodes to the common electrodes.

24. The multi-pixel LED package according to claim 22, wherein each of the common electrodes corresponding to the global connection line of the single fourth connector comprises a first branch, a second branch, and a third branch to which the second conductive electrodes of the first LED chip, the second LED chip, and the third LED chip are bonded, respectively, and a stem at which the first branch, the second branch, and the third branch merge; and the stem is integrated as a portion of the global connection line of the single fourth connector.

* * * * *